United States Patent
Ichikawa (10) Patent No.: US 9,576,638 B2
(45) Date of Patent: Feb. 21, 2017

(54) INFORMATION PROCESSING APPARATUS, CONTROL METHOD FOR THE SAME, PROGRAM FOR THE SAME, AND STORAGE MEDIUM

(71) Applicant: CANON KABUSHIKI KAISHA, Tokyo (JP)

(72) Inventor: Masanori Ichikawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/375,740

(22) PCT Filed: Sep. 25, 2013

(86) PCT No.: PCT/JP2013/076755
§ 371 (c)(1),
(2) Date: Jul. 30, 2014

(87) PCT Pub. No.: WO2014/054665
PCT Pub. Date: Apr. 10, 2014

(65) Prior Publication Data
US 2015/0019805 A1  Jan. 15, 2015

(30) Foreign Application Priority Data

Oct. 2, 2012 (JP) ................. 2012-220717

(51) Int. Cl.
*G06F 11/30* (2006.01)
*G11C 11/406* (2006.01)
*G06F 12/06* (2006.01)

(52) U.S. Cl.
CPC ..... *G11C 11/40626* (2013.01); *G06F 11/3037* (2013.01); *G06F 11/3058* (2013.01); *G06F 12/063* (2013.01); *G06F 2212/2532* (2013.01)

(58) Field of Classification Search
CPC  G06F 11/00; G06F 12/063; G06F 2212/2532; G06F 12/06; G06F 2212/25; G06F 2212/253; G06F 13/1636; G11C 11/406; G11C 11/40615; G11C 11/40618; G11C 11/40603
See application file for complete search history.

(56) References Cited

U.S. PATENT DOCUMENTS 5,254,803 A  * 10/1993 Terao ................. G09B 15/04
84/478
8,380,042 B2 * 2/2013 Kawakami ........... G11B 19/047
386/239

(Continued)

FOREIGN PATENT DOCUMENTS

| JP | 2004-185542 A | 2/2004 |
| JP | 2004-355435 A | 12/2004 |
| JP | 2011-095974 A | 5/2011 |

OTHER PUBLICATIONS

Japanese Office Action dated May 23, 2015 in Japanese Application No. 2012-220717.

(Continued)

*Primary Examiner* — Mano Padmanabhan
*Assistant Examiner* — Jean Edouard
(74) *Attorney, Agent, or Firm* — Fitzpatrick, Cella, Harper & Scinto (57) ABSTRACT

An information processing apparatus according to an aspect of the present invention acquires temperature information for each of a plurality of memories in a wide IO memory device, and when execution of a job is instructed, decides on a memory having a lower temperature as the memory to be used by a functional module that corresponds to a function, based on the memory size to be used by the functional (Continued)

module that corresponds to the function, and on the acquired temperature information for the memories.

8 Claims, 8 Drawing Sheets

(56) References Cited

U.S. PATENT DOCUMENTS

| | | | | |
|---|---|---|---|---|
| 2002/0016898 A1* | 2/2002 | Hashimoto | ......... | G06F 13/1631 711/202 |
| 2003/0125896 A1* | 7/2003 | Charlton | ................ | G11C 29/02 702/118 |
| 2007/0106860 A1* | 5/2007 | Foster | ................... | G06F 1/3225 711/170 |
| 2008/0320178 A1* | 12/2008 | Shirasaki | ................ | G06F 13/28 710/22 |
| 2009/0276575 A1* | 11/2009 | Takai | .................. | G06F 12/0888 711/118 |
| 2009/0319871 A1* | 12/2009 | Shirai | ................. | G06F 11/1068 714/773 |
| 2009/0328055 A1* | 12/2009 | Bose | ..................... | G06F 1/3203 718/105 |
| 2010/0100341 A1* | 4/2010 | Kim | ..................... | G01R 22/063 702/62 |
| 2010/0118592 A1* | 5/2010 | Ishihara | .................. | G11C 8/12 365/148 |
| 2010/0325360 A1* | 12/2010 | Yoshitake | ........... | G06F 12/0817 711/125 |
| 2011/0023039 A1 | 1/2011 | Memik et al. | | |
| 2011/0107037 A1* | 5/2011 | Yoshida | .............. | G06F 11/3037 711/154 |
| 2011/0213913 A1* | 9/2011 | Yao | ..................... | G06F 12/0246 711/103 |
| 2011/0302582 A1* | 12/2011 | Jacobson | ................ | G06F 1/206 718/102 |
| 2012/0018885 A1* | 1/2012 | Lee | ........................ | H01L 23/481 257/738 |
| 2012/0030413 A1* | 2/2012 | Miyagawa | .......... | G06F 12/0246 711/103 |
| 2012/0221813 A1* | 8/2012 | Inoue | .................. | G06F 11/2064 711/162 |
| 2012/0249219 A1* | 10/2012 | Shoemaker | .............. | G01K 3/08 327/512 |
| 2012/0287731 A1* | 11/2012 | Kim | .................. | G11C 11/40626 365/189.07 |
| 2013/0036256 A1* | 2/2013 | Kawamura | ........... | G06F 3/0623 711/103 |
| 2013/0067136 A1* | 3/2013 | Bates | ....................... | G06F 12/00 711/103 |
| 2013/0178999 A1* | 7/2013 | Geissler | ............ | H05K 7/20836 700/300 |

OTHER PUBLICATIONS

Japanese Office Action dated Aug. 1, 2016 in corresponding Japanese Application No. 2012-220717.

Gotou, "Special Report : The next and after the next memory have emerged", DOS/V Power Report, vol. 22, No. 8, pp. 156-160, (Jun. 29, 2012).

* cited by examiner

| TEMPERATURE SENSOR NAME | TEMPERATURE INFORMATION |
|---|---|
| TEMPERATURE SENSOR 309 | 50°C |
| TEMPERATURE SENSOR 310 | 60°C |
| TEMPERATURE SENSOR 311 | 65°C |
| TEMPERATURE SENSOR 312 | 70°C |

INFORMATION PROCESSING APPARATUS, CONTROL METHOD FOR THE SAME, PROGRAM FOR THE SAME, AND STORAGE MEDIUM

TECHNICAL FIELD

The present invention relates to an information processing apparatus including a wide IO memory device stacked on an SoC die that includes a CPU, a control method for the same, a program for the same, and a storage medium.

BACKGROUND ART

In information processing apparatuses that include a CPU such as a microprocessor, a DRAM is often used for storage of data for executing an OS and various applications, and for temporary storage of data for executing image processing. The DRAM is connected to a CPU, an SoC (System on a Chip), or the like and used by them. Furthermore, in recent years, as functions have been added/enhanced in information processing apparatuses, the amount of memory bandwidth needed in DRAMs has increased. Because of this, the amount of memory bandwidth has been increased by raising the clock frequency during memory access, according to a standard such as DDR3 or DDR4. Furthermore, as another method, memory bandwidth is reserved by including multiple DRAM channels that are connected to a CPU or an ASIC (Application Specific Integrated Circuit). However, a new problem occurs in that increasing the clock frequency and employing multiple memory channels increases power consumption.

In view of this, wide IOs, which are a next-generation DRAM standard, are currently gaining attention. A wide IO is configured by placing a DRAM chip over an SoC die using a 3D stacking technique based on TSVs (Through-Silicon Vias). Features of the wide IO include being able to obtain a wide bandwidth that is over 12.8 GB/s (gigabytes per second) at most, with a wide data width of 512 bits, and having low power consumption due to the access frequency being suppressed to a low frequency. Also, by employing TSVs, the package size can be made thinner and smaller compared to a conventional PoP (Package on Package). Furthermore, as a countermeasure against heat caused by stacking memories in an SoC package, a temperature sensor that detects the memory temperature is built in, and the self-refresh rate is changed according to the detected temperature. Also, in this configuration, a data width of 512 bits is divided into four 128-bit channels and each channel is controlled individually. For example, a method of use is possible in which channel 1 and channel 2 are put in a self-refresh state, while channel 3 and channel 4 are used for normal memory access, or the like. A basic structure and basic access method for such a wide IO is disclosed in US2012/0018885.

The stacked structure of a wide IO is structurally susceptible to heat. For example, if a specific region of a SoC die and a DRAM chip of a wide IO placed on a layer above this specific region are activated at the same time, the temperature of the activated portions sometimes rises locally. This rise in temperature is accompanied by an exponential increase in leak current in the semiconductor and an increase in power consumption. In addition, the DRAM performs storage of data by storing charge in a capacitor included in each cell. Since the capacitors are naturally discharged by leak current in the semiconductor, it is necessary for the DRAM to charge the capacitors by performing a refresh operation, in order to preserve the stored data. The discharging of this charge depends on the temperature of the DRAM, and the higher the temperature is, the faster the discharge speed is. Accordingly, if the temperature of the DRAM becomes high, the refresh frequency needs to be increased. As a result, this invites an increase in power consumption caused by refresh operations, as well as the deterioration of the access performance of the DRAM due to not being able to access the DRAM during a refresh operation.

SUMMARY OF INVENTION

In order to solve the aforementioned problems in the conventional technology, an aspect of the present invention provides a technique by which the number of DRAMs that have localized high-temperature areas can be reduced, and the refresh rate and leak current of a DRAM can be reduced, by prioritizing the use of a low-temperature DRAM among wide IO DRAMs.

According to one aspect of the present invention, there is provided an information processing apparatus comprising: a wide IO memory device stacked on an SoC die that includes a CPU; temperature acquisition means for acquiring temperature information of a plurality of memories in the wide IO memory device; a plurality of functional modules for executing respective functions; and deciding means for, when execution of a function is instructed, deciding on a lower-temperature memory as a memory to be used by a functional module that corresponds to the function, based on a memory size to be used by the functional module that corresponds to the function, and the temperature information of the plurality of memories acquired by the temperature acquisition means.

According to another aspect of the present invention, there is provided a control method for controlling an information processing apparatus that includes a wide IO memory stacked on an SoC die that includes a CPU, the control method comprising steps of: acquiring temperature information of a plurality of memories in the wide IO memory device; and when execution of a function is instructed, deciding on a lower-temperature memory as a memory to be used by a functional module that corresponds to the function, based on a memory size to be used by the functional module that corresponds to the function, and the temperature information of the plurality of memories acquired in the acquiring step.

According to an aspect of the present invention, the number of DRAMs that have localized high-temperature areas can be reduced, and the refresh rate and leak current of a DRAM can be reduced by acquiring the temperature of wide IO DRAMs and prioritizing the use of DRAMs that are at lower temperatures. Thus, it is possible to suppress reductions in power-conservation and wide IO DRAM access performance.

Further features of the present invention will become apparent from the following description of exemplary embodiments (with reference to the attached drawings).

DESCRIPTION OF EMBODIMENTS

Hereinafter, embodiments of the present invention will be described in detail with reference to the accompanying drawings. It should be noted that the following embodiments are not intended to limit the scope of the appended claims, and that not all the combinations of features described in the embodiments are necessarily essential to the solving means of the present invention. Note that an MFP (digital Multi-Function Peripheral) having multiple functions such as scanning, printing, and copying will be described in the embodiments below as an example of an information processing apparatus that includes a wide IO according to embodiments of the present invention.

Figure 1:
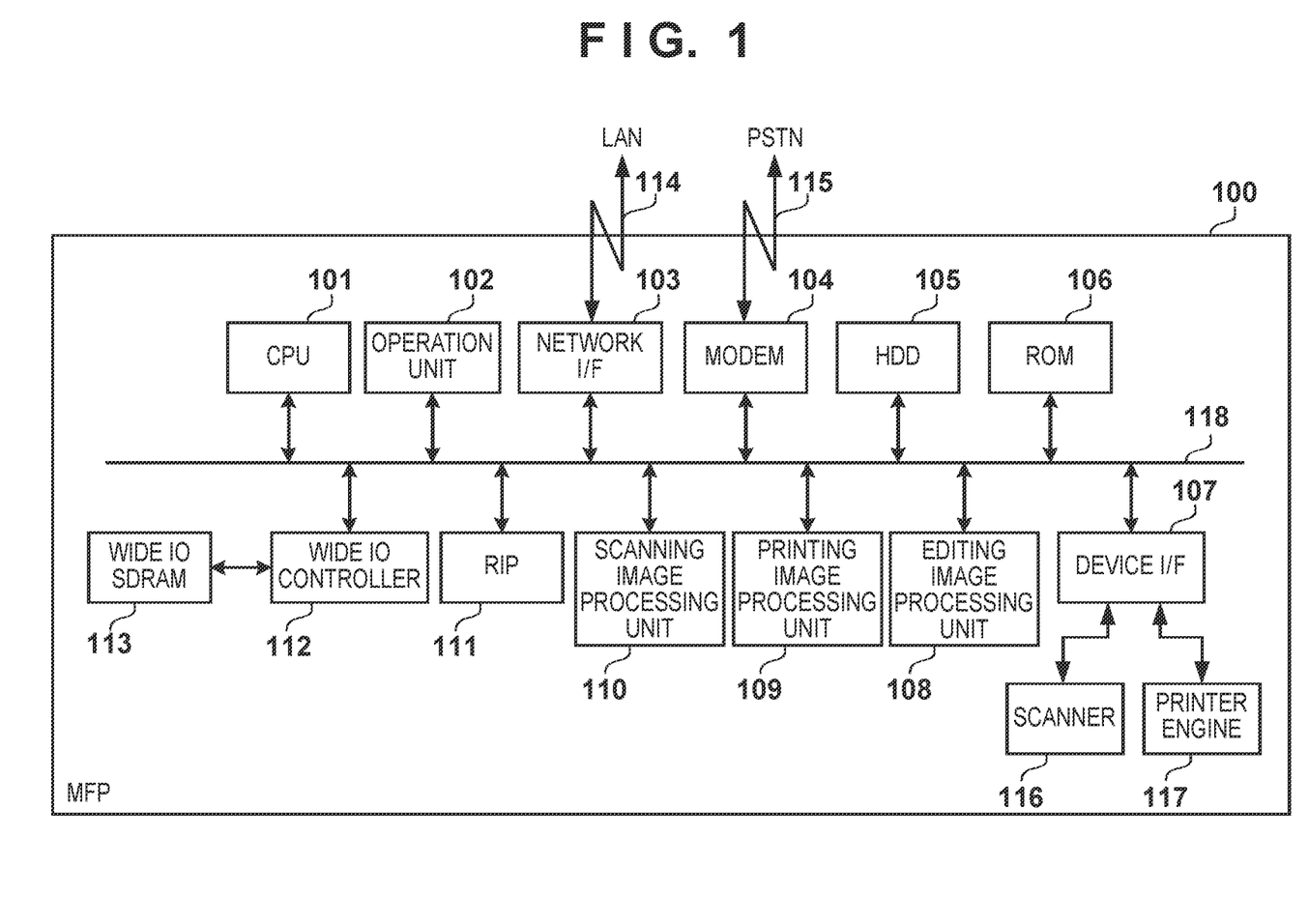
FIG. 1 is a block diagram showing an overall configuration of an MFP according to an embodiment of the present invention.

FIG. 1 is a block diagram showing an overall configuration of an MFP according to the present embodiment.

An MFP 100 has a scanner 116 that is an image input device, and a printer engine 117 that is an image output device, and these are connected to a system bus 118 via a device interface (I/F) 107. The MFP 100 can perform scanning of an original image using the scanner 116, and printing using the printer engine 117, under control of the CPU 101. Also, the MFP 100 is connected to a LAN 114 and a public switched telephone network (PSTN) 115, and can input and output image data and device information regarding an external device connected to the LAN or the PSTN via the LAN 114 and the PSTN 115.

A CPU 101 controls the operation of this MFP 100 by executing a program loaded from an HDD 105 to a wide IO SDRAM 113 by a boot program stored in a ROM 106. An operation unit 102 has an input unit such as a touch panel or a keyboard, and a display unit, and receives instructions from a user, and causes the display unit to display messages, processing results, and the like to the user. The network I/F 103 is realized by a LAN card for example, and performs input/output of device information and image data with external devices via the LAN 114. A modem 104 performs input/output of control information and image data with external devices via the PSTN 115. The HDD (hard disk drive) 105 stores an OS, various application programs, and the like, and holds input image data and the like. The ROM 106 stores a boot program and various data. The device I/F 107 is connected to the printer engine 117 and the scanner 116, and performs processing for image data transmission with the scanner 116, the printer engine 117, and the system bus 118.

An editing image processing unit 108 performs, on image data, various types of image processing, such as rotation and size adjustment, color processing, trimming/masking, binary conversion, multi-value conversion, and blank sheet determination. The printing image processing unit 109 performs image processing and the like that corresponds to the printer engine 117 on image data to be output to the printer engine 117. The scanning image processing unit 110 performs various types of processing such as correcting, manipulating, and editing on image data input from the scanner 116. The RIP 111 renders page description language (PDL) code into image data.

A wide IO controller 112 converts memory access commands from the CPU 101, the image processing units 108 to 110, and the like into commands that are interpretable by the wide IO SDRAM 113 and accesses the wide IO SDRAM 113. The wide IO SDRAM 113 stores programs to be executed by the CPU 101, and provides a system working memory for the CPU 101 to operate. Additionally, the wide IO-SDRAM 113 is also an image memory for temporarily storing input image data. As shown in FIG. 1, the system bus 118 connects the aforementioned devices and the CPU 101, and transfers control signals, data, and the like therebetween.

Figure 2A:
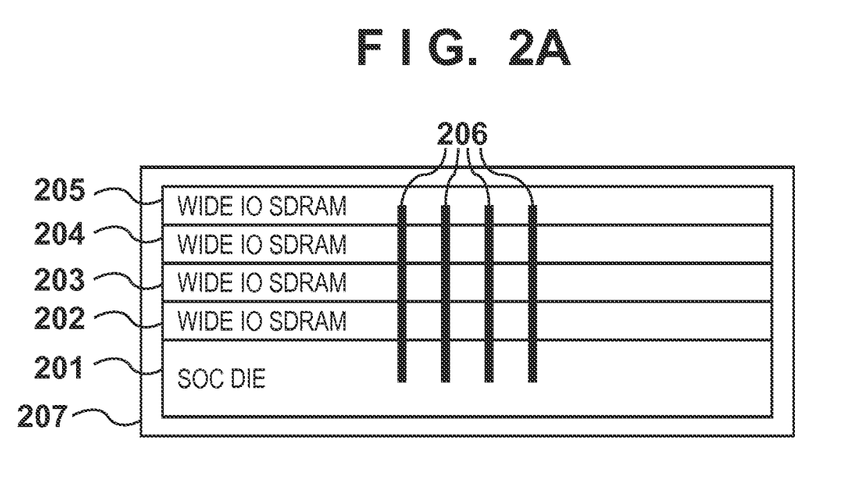
FIGS. 2A and 2B are pattern diagrams showing the structure of a wide IO SDRAM according to an embodiment.
Figure 2B:
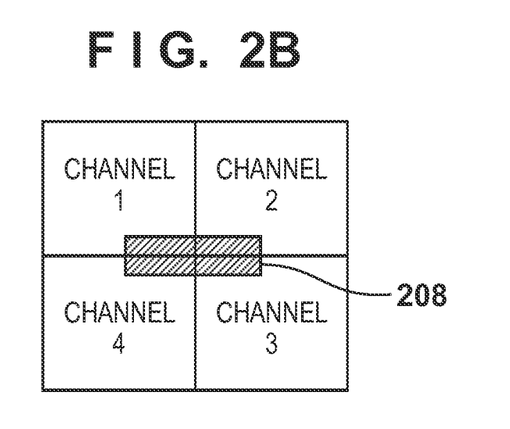

FIGS. 2A and 2B are pattern diagrams showing the structure of the wide IO SDRAM 113 according to the present embodiment, FIG. 2A being a side view of the wide IO SDRAM and an SoC die viewed from the side, and FIG. 2B being a top view.

In the present embodiment, an SoC die 201 includes the CPU 101, the device I/F 107, the RIP 111, the image processing units 108 to 110, and the like. Wide IO SDRAM chips 202 to 205 are stacked over the SoC die 201 and connected to the SoC die 201 by a Through-Silicon Via (TSV) 206. The wide IO SDRAM chips can be stacked in four layers at most, according to the necessary memory capacity, and an example of stacking in four layers is shown in FIG. 2A. An SoC package 207 contains the SoC die 201 and the wide IO SDRAM chips 202 to 205 in one package. As shown in FIG. 2B, the wide IO SDRAM I/F 208 is arranged in the central portion of the SoC die 201 and the wide IO SDRAM chips 202 to 205.

Figure 3:
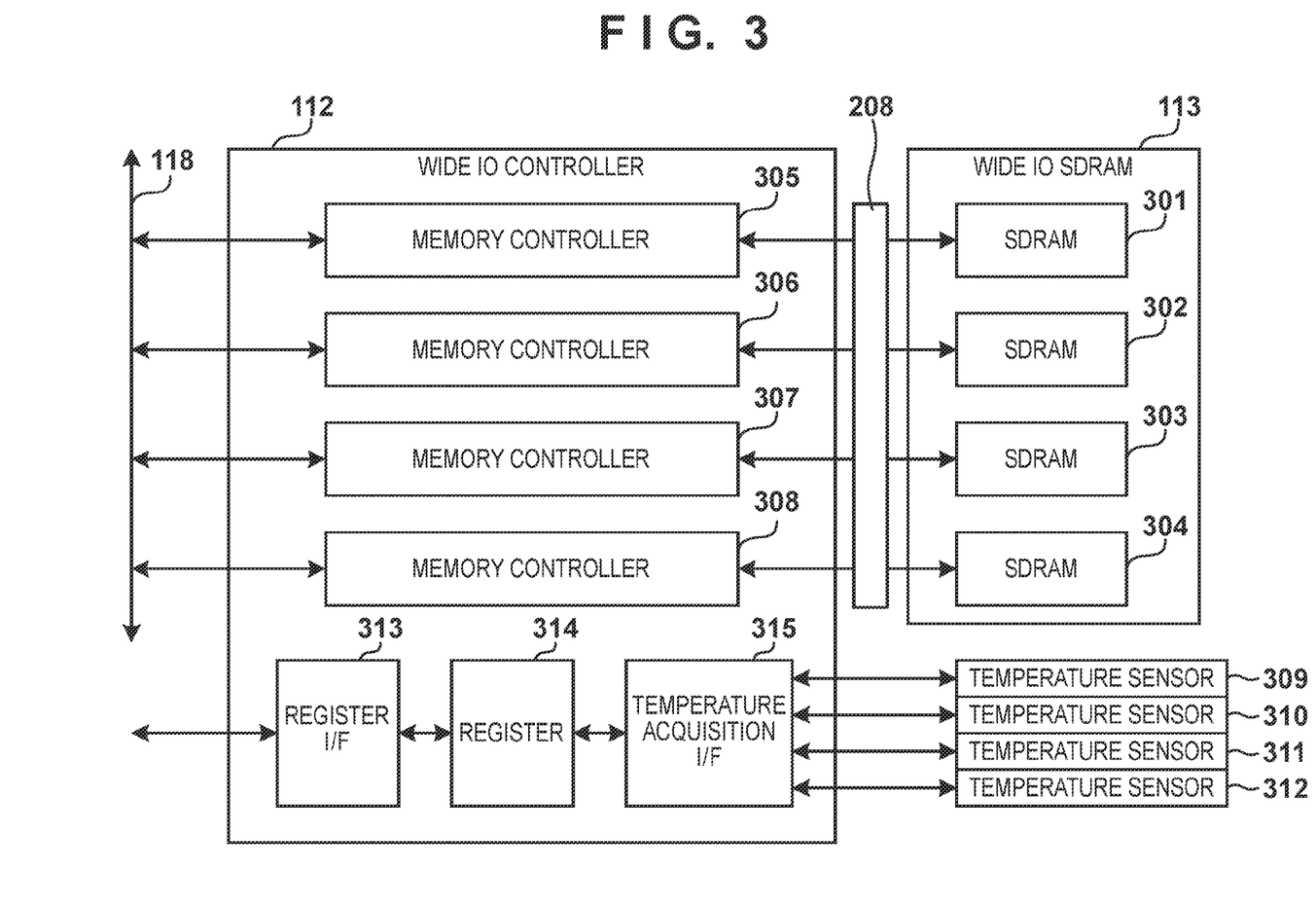
FIG. 3 is a block diagram showing the internal configuration of a wide IO controller according to an embodiment.

FIG. 3 is a block diagram showing the internal configuration of the wide IO controller 112 according to the present embodiment.

In FIG. 3, the wide IO controller 112 is connected between the system bus 118 and the wide IO SDRAM 113, as shown in FIG. 1. The wide IO controller 112 is connected to temperature sensors 309 to 312, which are not illustrated in FIG. 1.

SDRAMs 301 to 304 are four memories provided in the wide IO SDRAM 113, and each includes a dedicated interface (I/F) as shown in FIG. 3. The dedicated I/Fs correspond to the four channels of the wide IO SDRAM chips 202 to 205, which are stacked over the SoC die 201 as described above. Also, the dedicated I/Fs correspond to the wide IO SDRAM I/F 208 in FIG. 2B. The memory controllers 305 to 308 can individually control power supply voltage, as well as the supply and termination of clock signals, for the SDRAMs 301 to 304. Each of the memory controllers 305 to 308 accesses a corresponding connected SDRAM by converting a memory access command from the system bus 118 into a command that is interpretable by the SDRAM. The temperature sensors 309 to 312 measure the temperature of the corresponding SDRAM out of the SDRAMs 301 to 304.

Figure 4:
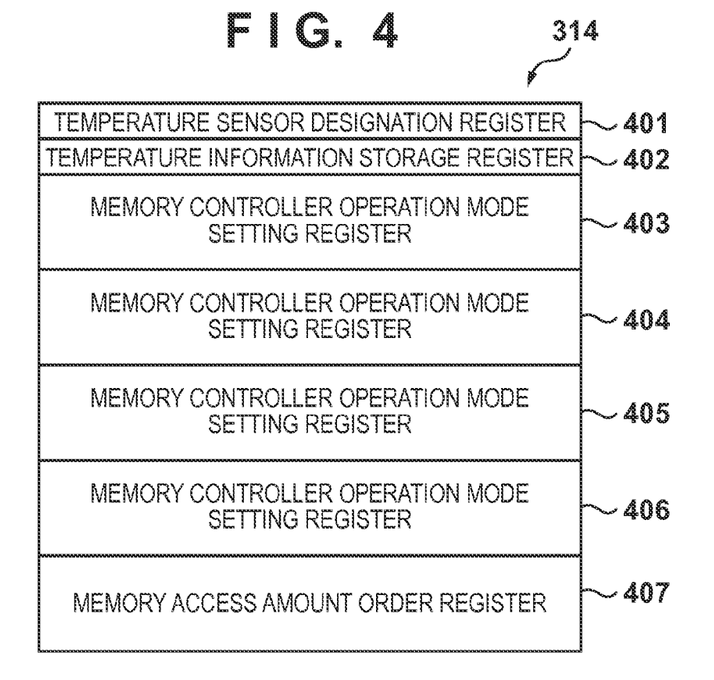
FIG. 4 is a diagram for describing a configuration of a register according to an embodiment.

A register I/F 313 receives access from the CPU 101 via a register-dedicated bus (not shown). A register 314 stores temperature information acquired by the temperature acquisition I/F 315 from the temperature sensors 309 to 312, as well as operation mode setting information for the memory controllers 305 to 308, which is set by the CPU 101. If the temperature acquisition I/F 315 detects a temperature information acquisition request from a temperature information storage register 402 (FIG. 4), which will be described later, the temperature acquisition I/F 315 issues a command for acquiring the temperature information to the temperature sensor designated by a later-described temperature sensor designation register 401 (FIG. 4). Thus, the temperature acquisition I/F 315 acquires the temperature information from the corresponding temperature sensor. The temperature acquisition I/F 315 stores the acquired temperature information to the temperature information storage register 402.

FIG. 4 is a diagram for describing the configuration of the register 314 according to the present embodiment.

The register 314 has the temperature sensor designation register 401, the temperature information storage register 402, memory controller operation mode setting registers 403 to 406, and a memory access amount order register 407. The temperature sensor designation register 401 is a register that stores information for designating a temperature sensor to be the target when the CPU 101 is to acquire the temperature information of a temperature sensor. Since the present embodiment will be described using an example in which four temperature sensors are provided, it can be configured by a two-bit register, and can specify each of the four temperature sensors by the states of the two bits. When a temperature information acquisition request from the CPU 101 is input, the temperature information storage register 402 makes a request to the temperature acquisition I/F 315 to acquire the temperature information of the temperature sensor designated by the temperature sensor designation register 401. Also, the temperature information storage register 402 stores temperature information acquired from the temperature acquisition I/F 315, and outputs the temperature information stored therein in accordance with a temperature information readout request from the CPU 101.

Figure 9:
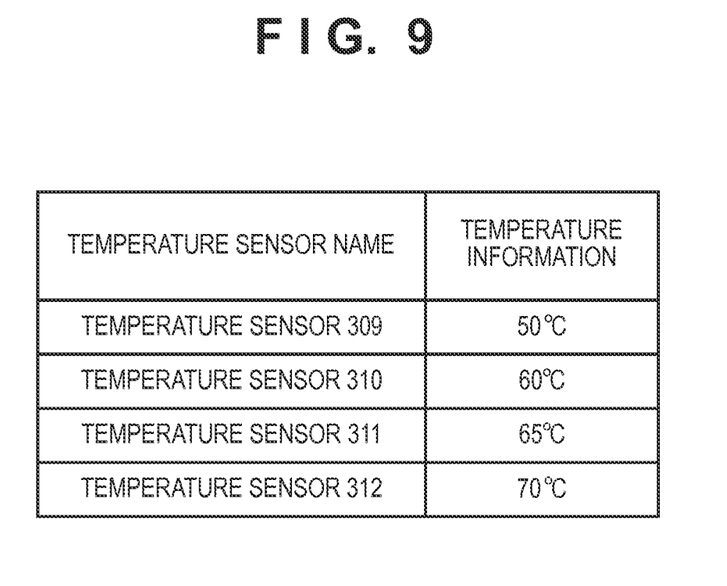
FIG. 9 is a diagram showing an example of the temperature information acquired by the temperature sensors, according to an embodiment.

FIG. 9 is a diagram showing an example of temperature information that indicates the temperature of the SDRAMs 301 to 304 acquired from the temperature sensors 309 to 312 in the present embodiment. FIG. 9 shows that the SDRAM 304, which corresponds to memory channel 4 and whose temperature was measured by the temperature sensor 312, has the highest temperature, while the SDRAM 301, which corresponds to memory channel 1 and whose temperature was measured by the temperature sensor 309, has the lowest temperature.

The memory controller operation mode setting registers 403 to 406 are registers for setting the operation modes of the memory controllers 305 to 308 respectively. The memory controller operation mode setting registers 403 to 406 respectively store setting values related to memory control for the SDRAMs 301 to 304. Here, examples of setting values related to memory control include time intervals of refresh operations for the SDRAMs 301 to 304, timing parameters related to memory access, and the like. Note that the memory controller operation mode setting register 403 sets the operation mode of the memory controller 305, and the memory controller operation mode setting register 404 sets the operation mode of the memory controller 306. Also, the memory controller operation mode setting register 405 sets the operation mode of the memory controller 307, and the memory controller operation mode setting register 406 sets the operation mode of the memory controller 308.

Additionally, for each functional module that accesses the SDRAMs 301 to 304, the amounts of SDRAM memory access needed by the functional modules are ordered in descending order, and that order is stored by the memory access amount order register 407. Note that in the present embodiment, the editing image processing unit 108, the printing image processing unit 109, the scanning image processing unit 110, and the RIP 111, which are shown in FIG. 1, correspond to these functional modules. The CPU 101 references the values (order) of the memory access amount order register 407, and allocates memory to each functional module. The values in the memory access amount order register 407 are values decided on in advance during the designing of the MFP 100 according to the present invention, and during activation, they are set by the CPU 101 writing the order in the memory access amount order register 407.

Figure 5:
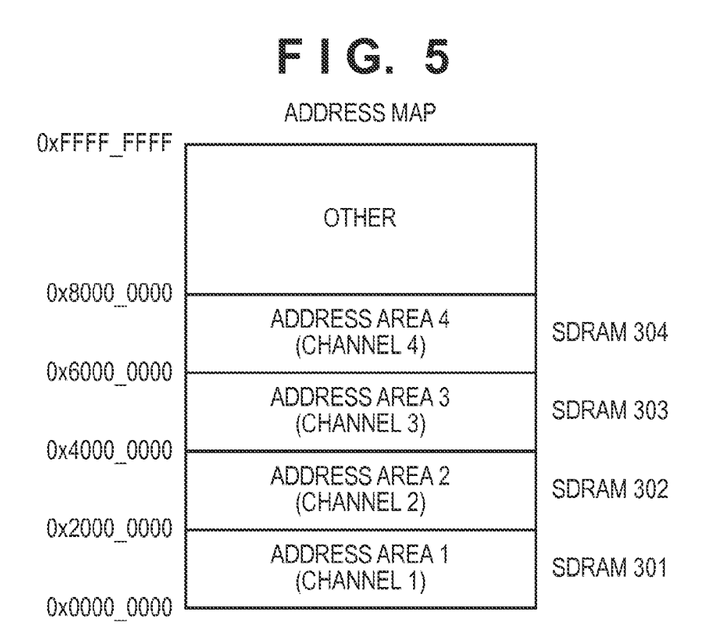
FIG. 5 is a diagram for describing an address map showing address areas allocated to an SDRAM according to an embodiment.

FIG. 5 is a diagram for describing an address map indicating address areas allocated to the SDRAMs 301 to 304, according to the present embodiment.

In the present embodiment, an address area 1 is allocated to the SDRAM 301, an address area 2 is allocated to the SDRAM 302, an address area 3 is allocated to the SDRAM 303, and an address area 4 is allocated to the SDRAM 304. However, the sizes of the address areas are not limited to those illustrated in FIG. 5. Note that the aforementioned program of the CPU 101 is loaded to the address area 1 in the SDRAM 301.

Figure 6:
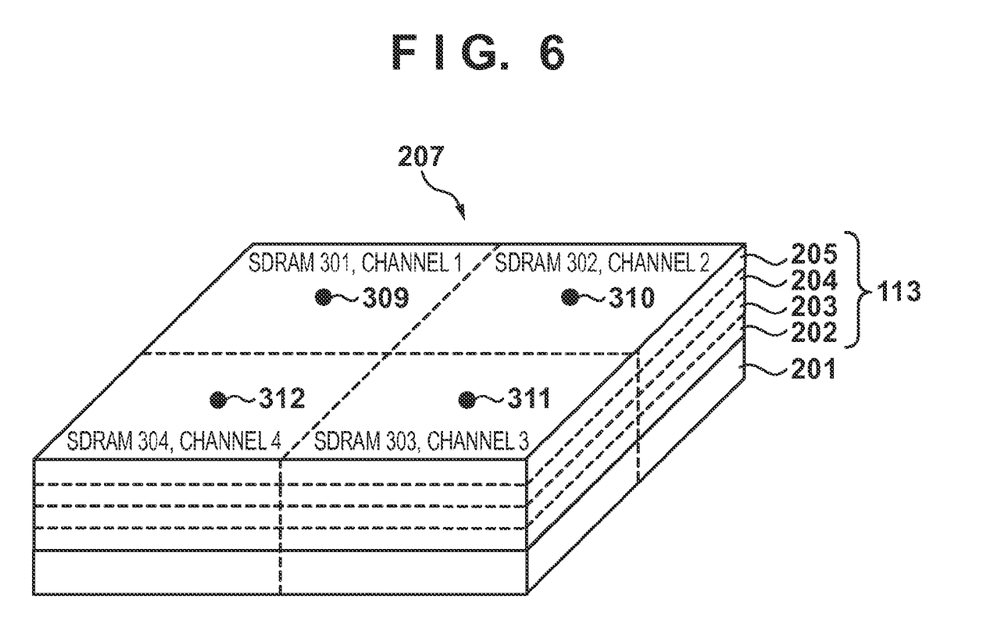
FIG. 6 is an overhead view of an SoC package according to an embodiment.

FIG. 6 is an overhead view of the SoC package 207 for simplifying the description of the physical positional relationships of the wide IO SDRAM chips 202 to 205 and the SoC die 201 in FIG. 2.

The SoC die 201 includes the CPU 101, the device I/F 107, the RIP 111, the aforementioned image processing units 108 to 110, and the like. The channels (memory channels) 1 to 4 in FIG. 2B correspond to the upper left, upper right, bottom left, and bottom right portions of the plane of the SoC package 207. Also, the four portions similarly correspond to the SDRAMs 301 to 304 in FIG. 3. As described above, the wide IO SDRAM 113 is a memory stacked over the SoC die 201. Additionally, in the present embodiment, the devices in the SDRAMs 301 to 304 are stacked in four layers above the four portions of the SoC die 201, as shown in FIG. 6. The temperature sensors 309 to 312 are built into the devices in the SDRAMs 301 to 304 so that the internal temperature of each memory can be measured. However, this is merely an example, and the arrangement of the SDRAMs and the temperature sensors is not limited to FIG. 6. Also, the temperature sensors 309 to 312 may be provided within the SoC die 201, or they may be provided within the memory of the wide IO SDRAM 113.

Figure 7:
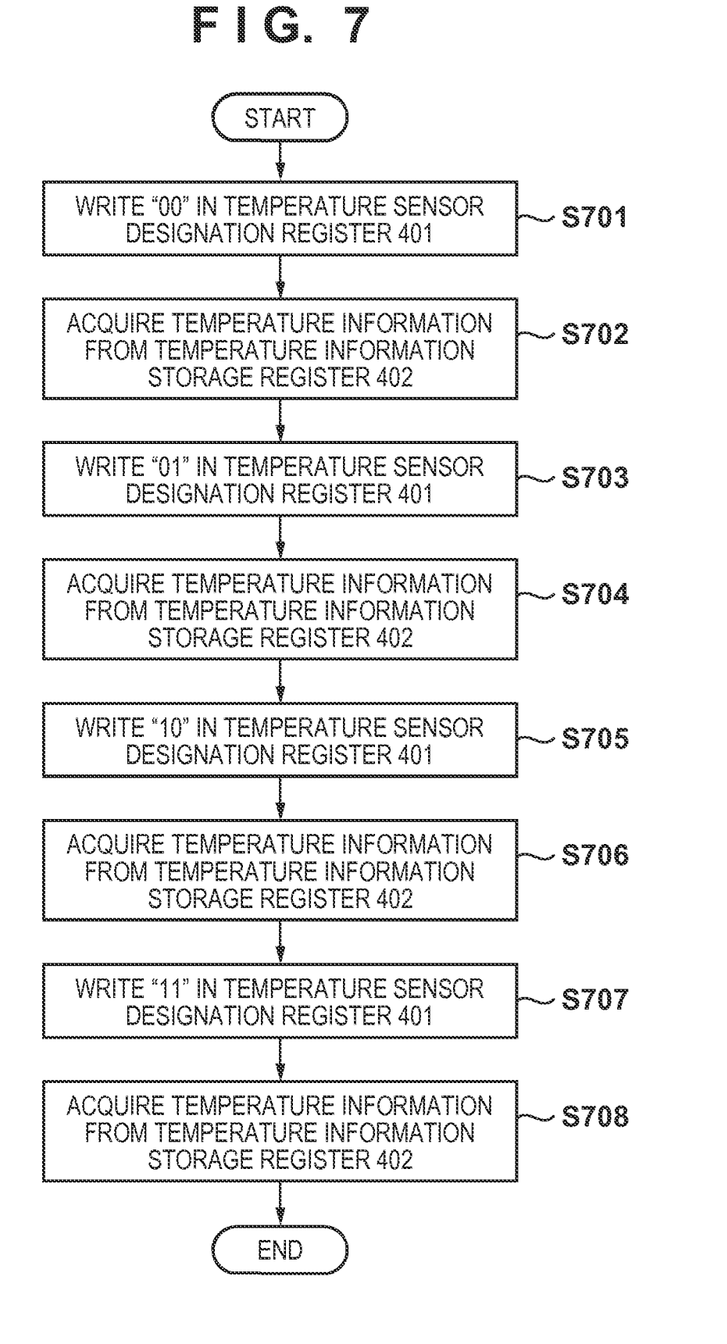
FIG. 7 is a flowchart for describing processing for the CPU to acquire temperature information measured by the temperature sensors in the MFP according to an embodiment.

FIG. 7 is a flowchart showing a procedure of processing performed by the CPU 101 to acquire temperature information indicating the temperatures of the SDRAMs 301 to 304 measured by the temperature sensors 309 to 312 in the MFP 100 according to the present embodiment. Since the MFP 100 includes four temperature sensors in the present embodiment, the flowchart in FIG. 7 shows processing for acquiring temperature information from the four temperature sensors 309 to 312. Note that the program for executing this processing is installed in advance on the HDD 105. This processing is realized in the MFP 100 by the CPU 101 loading the program from the HDD 105 to the SDRAM 301 and executing the loaded program.

First, in step S701, the CPU 101 writes "00" in the temperature sensor designation register 401. In the present embodiment, the SoC package 207 includes four temperature sensors. Because of this, the CPU 101 associates the temperature sensors with setting values in the temperature sensor designation register 401 in the following manner in order to designate the temperature sensors. That is to say, the values in the temperature sensor designation register 401, namely "00", "01", "10", and "11", are associated with the temperature sensors 309 to 312, respectively. Thus, in step S701, the CPU 101 writes "00" in the temperature sensor designation register 401 in order to designate the temperature sensor 309.

Next, moving to step S702, the CPU 101 issues a temperature information readout request to the temperature information storage register 402 and acquires temperature information indicating the temperature of the SDRAM 301, which was measured by the temperature sensor 309. Here, as described above, upon detecting the readout request from the CPU 101, the temperature information storage register 402 acquires temperature information from the temperature sensor designated by the temperature sensor designation register 401. Moreover, the temperature information storage register 402 outputs the acquired temperature information to the CPU 101 as response data in response to the readout request from the CPU 101. Thus, the CPU 101 acquires the temperature information from the temperature sensor 309 in step S702.

Next, moving to step S703, the CPU 101 writes "01" in the temperature sensor designation register 401 in order to acquire temperature information indicating the temperature of the SDRAM 302, which was measured by the temperature sensor 310. Subsequently, moving to step S704, the CPU 101 issues a temperature information readout request to the temperature information storage register 402 and acquires the temperature information from the temperature sensor 310.

Next, moving to step S705, the CPU 101 writes "10" in the temperature sensor designation register 401 in order to acquire temperature information indicating the temperature of the SDRAM 303, which was measured by the temperature sensor 311. Subsequently, moving to step S706, the CPU 101 issues a temperature information readout request to the temperature information storage register 402 and acquires the temperature information from the temperature sensor 311.

Next, moving to step S707, the CPU 101 writes "11" in the temperature sensor designation register 401 in order to acquire temperature information indicating the temperature of the SDRAM 304, which was measured by the temperature sensor 312. Subsequently, moving to step S708, the CPU 101 issues a temperature information readout request to the temperature information storage register 402 and acquires the temperature information from the temperature sensor 312.

According to the aforementioned processing, the CPU 101 can acquire the temperature information measured by the temperature sensors, in other words, the temperature information of the SDRAMs or the channels.

Figure 8:
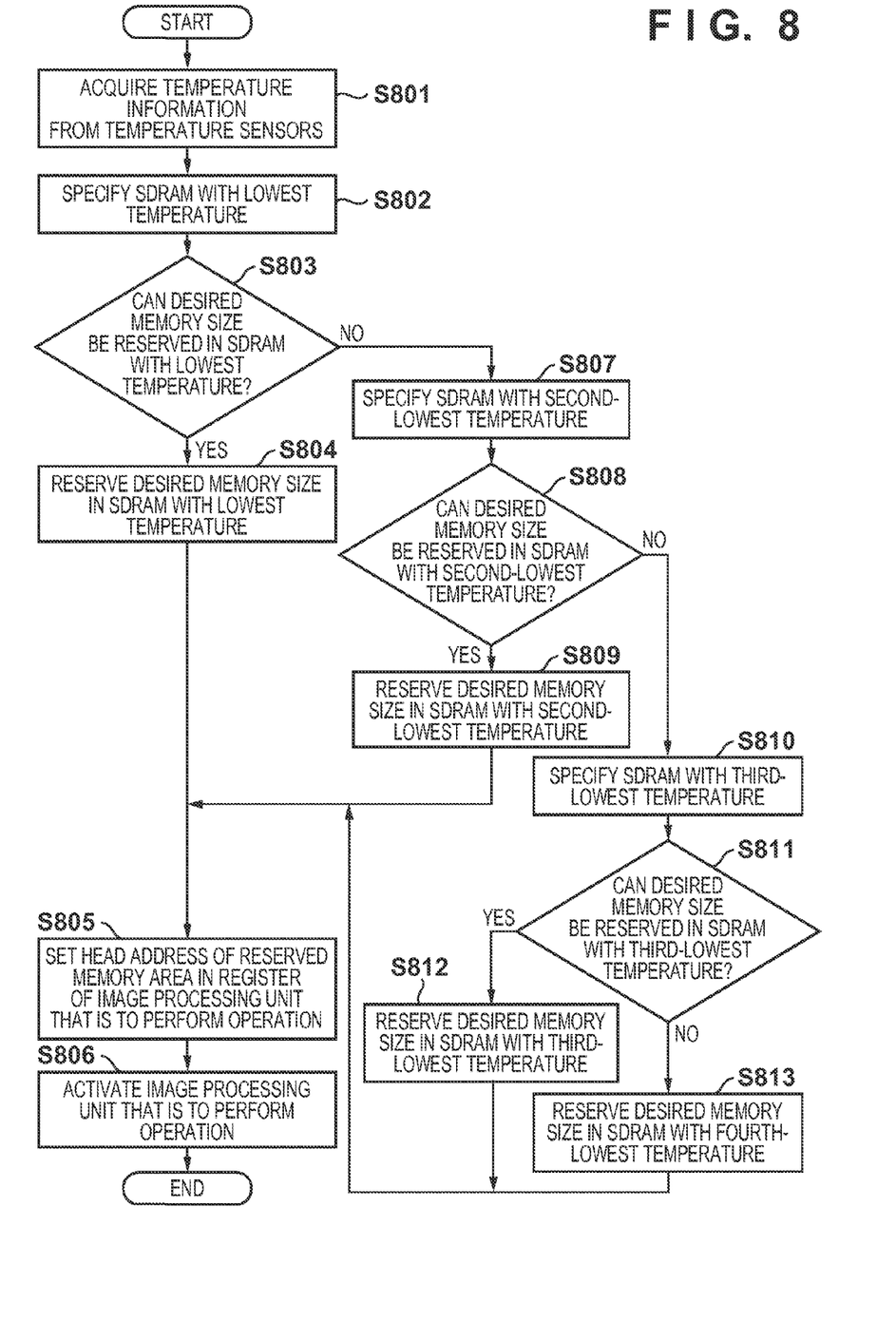
FIG. 8 is a flowchart for describing processing for deciding on a memory channel to be used when a job is to be executed in the MFP according to an embodiment.

FIG. 8 is a flowchart for describing processing for deciding on a memory channel (SDRAM) to be used when a job is to be executed in the MFP according to the present embodiment. Note that a program for executing this processing is installed in the HDD 105, and this processing is realized by the program being loaded to an SDRAM for execution, and being executed by the CPU 101.

First, in step S801, the CPU 101 acquires the temperature information from the temperature sensors. The acquisition of the temperature information by the CPU 101 is executed according to the procedure that was described with reference to the flowchart of FIG. 7. In the present embodiment, the temperature information acquired in step S801 is described as being a value such as that shown in FIG. 9, for example. That is to say, the temperature detected by the temperature sensor 309 is 50° C., the temperature detected by the temperature sensor 310 is 60° C., the temperature detected by the temperature sensor 311 is 65° C., and the temperature detected by the temperature sensor 312 is 70° C.

Next, the procedure moves to step S802, where the CPU 101 specifies the SDRAM with the lowest temperature based on the temperature information acquired in step S801. In the present embodiment, as is apparent from FIG. 9, the lowest temperature in the temperature information acquired in step S801 is 50° C., which was measured by the temperature sensor 309. Thus, the SDRAM 301 is specified here as the SDRAM with the lowest temperature.

Next, the procedure moves to step S803, where the CPU 101 references the address area in the SDRAM with the lowest temperature, which was specified in step S802, and determines whether or not a memory area corresponding to the memory size needed by the image processing unit that is to perform an operation can be reserved in that SDRAM. That is to say, the CPU 101 determines whether or not the memory size needed for the image processing unit can be reserved in the addresses 0x0000_0000 to 0x2000_0000, which were allocated to the SDRAM 301. Here, if the CPU 101 determines that a memory area of the necessary size can be reserved in the SDRAM, the procedure moves to step S804. In step S804, the CPU 101 reserves a memory area in the SDRAM with the lowest temperature, and the procedure moves to step S805. In step S805, the CPU 101 sets the head address of the memory area reserved in the SDRAM in a register for the image processing unit that is to perform an operation. Then, the procedure moves to step S806, where the CPU 101 activates the image processing unit and carries out image processing and the like that is necessary for the job that was designated using the operation unit 102, or the like. The activation of the image processing unit is performed by, for example, putting the setting value of an enable register provided in the image processing unit in an enabled state.

Here, a simple description will be given for the processing for using the memory area in the image processing unit. The image processing unit here may be the aforementioned image editing image processing unit 108, printing image processing unit 109, or scanning image processing unit 110. Various types of filter processing and the like performed in smoothing processing, image region determination processing, and the like are provided in the image processing unit. Normally, this filter processing requires a buffer for storing the number of lines of the raster-format input image data that corresponds to the filter window width. The present embodiment has a configuration such that the buffer for storing this predetermined number of lines is realized using an area of the wide IO SDRAM.

On the other hand, in step S803, if the CPU 101 determines that a memory area of the necessary memory size cannot be reserved in that SDRAM, the procedure moves to step S807, where the CPU 101 specifies the SDRAM having the second-lowest temperature based on the temperature information acquired in step S801. Since the second-lowest temperature in the example in FIG. 9 is 60° C., which was measured by the temperature sensor 310, the SDRAM 302 can be specified as the SDRAM having the second-lowest temperature in the present embodiment.

Next, the procedure moves to step S808, where the CPU 101 references the address area in the SDRAM having the second-lowest temperature, which was specified in step S807, and determines whether or not a memory area corresponding to the memory size needed by the image processing unit that is to perform an operation can be reserved in the SDRAM. That is to say, the CPU 101 determines whether or not the memory size needed by the image processing unit can be reserved in the addresses 0x2000_0000 to 0x4000_0000, which were allocated to the SDRAM 302. Here, if the CPU 101 determines that a memory area with the necessary memory size can be reserved in the SDRAM, the procedure moves to step S809, where the CPU 101 reserves the memory area in the SDRAM having the second-lowest temperature, and the procedure moves to step S805. Since the processing in steps S805 and S806 is similar to the aforementioned processes, the description will not be repeated.

On the other hand, in step S808, if the CPU 101 determines that a memory area having the necessary memory size cannot be reserved in the SDRAM with the second-lowest temperature, the procedure moves to step S810, where the CPU 101 specifies the SDRAM having the third-lowest temperature based on the temperature information acquired in step S801. In the present embodiment, the third-lowest temperature in FIG. 9 is 65° C., which was measured by the temperature sensor 311. Thus, the SDRAM 303 can be specified as the SDRAM having the third-lowest temperature.

Next, the procedure moves to step S811, where the CPU 101 references the address area in the SDRAM having the third-lowest temperature, which was specified in step S810, and determines whether or not a memory area corresponding to the memory size needed by the image processing unit that is to perform an operation can be reserved in the SDRAM. That is to say, the CPU 101 determines whether or not a memory area corresponding to the memory size needed by the image processing unit can be reserved in the addresses 0x4000_0000 to 0x6000_0000, which were allocated to the SDRAM 303. Here, if the CPU 101 determines that the memory area with the necessary memory size can be reserved, the procedure moves to step S812, where the CPU 101 reserves the memory area in the SDRAM having the third-lowest temperature, and the procedure moves to step S805. Since the processing in steps S805 and S806 is similar to the aforementioned processes, the description will not be repeated.

On the other hand, in step S811, if the CPU 101 determines that a memory area having the necessary memory size cannot be reserved in the SDRAM with the third-lowest temperature, the procedure moves to step S813, where the CPU 101 specifies the SDRAM 304, which has the fourth-lowest temperature. Then, the CPU 101 reserves a memory area having the memory size needed by the image processing unit in the addresses 0x6000_0000 to 0x8000_0000, which were allocated to the SDRAM 304, and the procedure moves to step S805. Note that in step S813, it is possible to terminate with an error when a memory area having the necessary memory size cannot be reserved in the SDRAM 304.

Note that the memory area to which the head address was set in the image processing unit register in step S805 is released by the CPU 101 when the processing performed by the image processing unit ends.

Additionally, the number of reserved memory areas may be stored for each memory, and consideration may be given to the number of memory areas reserved for each memory when deciding on the SDRAM in which the memory area needed by the image processing unit that is to perform an operation is allocated. For example, even if it is determined that the memory area needed by the image processing unit that is to perform an operation can be reserved in the SDRAM with the lowest temperature in step S803 in FIG. 8, when the number of memory areas for that SDRAM is at or above a predetermined number, the SDRAM with the second-lowest temperature may be specified. This is because when the number of memory areas reserved for that memory (SDRAM) is at or above a predetermined number, it can be determined that the temperature of that memory can possibly rise in the future, and therefore countermeasures for preventing such a situation are taken in advance.

As described above, according to the present embodiment, the temperatures of DRAMs in a wide IO memory device are acquired, and a memory area needed by an image processing unit required to operate in order to execute a job is reserved with priority given to an SDRAM having a low temperature. Thus, it is possible to prevent a further increase in temperature in high-temperature SDRAMs, and therefore it is possible to suppress reductions in power conservation and memory access performance which accompany increases in DRAM temperature.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-220717, filed Oct. 2, 2012 which is hereby incorporated by reference herein in its entirety.

The invention claimed is:

1. An image processing apparatus comprising:
a memory device including a plurality of memories and stacked on an SoC die, wherein the memory device is connected to an image processing controller via a memory controller;
a plurality of image processing modules configured to execute respective image processing functions in accordance with an image processing job;
a temperature acquisition unit, implemented by the image processing controller, configured to acquire temperature information of plurality of memories of the memory device via the memory controller before the image processing controller activates one of the image processing modules; and
a deciding unit, implemented by the image processing controller, configured to, when execution of an image processing function is instructed and before the image processing controller activates an image processing module within the image processing modules that corresponds to the image processing function, decide on a lower-temperature memory within the plurality of memories that is to be used by the image processing module, based on a memory size to be used by the image processing module, and the temperature information of the plurality of memories acquired by the temperature acquisition unit.

2. The image processing apparatus according to claim 1, wherein
when a memory area of a memory size that is to be used by the image processing module can be reserved in a memory with a lowest temperature, the deciding unit decides on the memory with the lowest temperature as a memory to be used by the image processing module, and
in a case where a memory area of a memory size that is to be used by the image processing module cannot be reserved in the memory with the lowest temperature, when a memory area of a memory size that is to be used by the image processing module can be reserved in a memory with a next-lowest temperature, the deciding unit decides on the memory with the next-lowest temperature as the memory to be used by the image processing module, wherein the decision in the deciding unit is performed before the image processing controller activates the image processing module.

3. The image processing apparatus according to claim 2, further comprising
an activation unit configured to activate the image processing module by setting a head address of the memory area decided on by the deciding unit in the image processing module.

4. The image processing apparatus according to claim 1, wherein
when the execution of the job is instructed, the temperature acquisition unit acquires the temperature information of the plurality of memories.

5. The image processing apparatus according to claim 2, further comprising
a releasing unit configured to, when processing performed by the image processing module ends, release the memory area reserved by the deciding unit.

6. The image processing apparatus according to claim 1, further comprising
a storage unit configured to store a number of reserved memory areas for each memory,
wherein the deciding unit further references the number of memory areas for the memories stored in the storage unit to decide on the memory to be used by the image processing module.

7. A control method for controlling an image forming apparatus that includes a memory device including a plurality of memories and stacked on an SoC die, wherein the memory device is connected to an image processing controller via a memory controller, and wherein the image forming apparatus further includes a plurality of image processing modules configured to execute respective image processing functions in accordance with an image processing job, the method comprising steps of:
acquiring temperature information of plurality of memories of the memory device via the memory controller before the image processing controller activates one of the image processing modules; and
deciding, when execution of an image processing function is instructed and before the image processing controller activates an image processing module within the image processing modules that corresponds to the image processing function, on a lower-temperature memory within the plurality of memories that is to be used by the image processing module, based on a memory size to be used by the image processing module, and the acquired temperature information of the plurality of memories.

8. A non-transitory computer-readable storage medium storing a computer program for causing a computer to execute steps of a method for controlling an image forming apparatus that includes a memory device including a plurality of memories and stacked on an SoC die, wherein the memory device is connected to an image processing controller via a memory controller, and wherein the image forming apparatus further includes a plurality of image processing modules configured to execute respective image processing functions in accordance with an image processing job, the method comprising steps of:
acquiring temperature information of plurality of memories of the memory device via the memory controller before the image processing controller activates one of the image processing modules; and
deciding, when execution of an image processing function is instructed and before the image processing controller activates an image processing module within the image processing modules that corresponds to the image processing function, on a lower-temperature memory within the plurality of memories that is to be used by the image processing module, based on a memory size to be used by the image processing module, and the acquired temperature information of the plurality of memories.

* * * * *